United States Patent [19]

Kanuma

[11] 4,388,537

[45] Jun. 14, 1983

[54] SUBSTRATE BIAS GENERATION CIRCUIT

[75] Inventor: Akira Kanuma, Stanford, Calif.

[73] Assignee: Tokyo Shibaura Denki Kabushiki Kaisha, Japan

[21] Appl. No.: 212,520

[22] Filed: Dec. 3, 1980

[30] Foreign Application Priority Data

Dec. 27, 1979 [JP] Japan ............................... 54-171657

[51] Int. Cl.[3] .......................... H03B 5/24; H03L 7/04

[52] U.S. Cl. ................................ 307/297; 307/296 R; 307/304; 331/57

[58] Field of Search .................... 307/200 B, 297, 304, 307/296 R; 331/57, 111

[56] References Cited

U.S. PATENT DOCUMENTS

| | | | |
|---|---|---|---|
| T954,006 | 1/1977 | Lee et al. | 331/57 X |
| 3,806,741 | 4/1974 | Smith | 307/304 |
| 4,115,710 | 9/1978 | Lou | 307/200 B X |
| 4,142,114 | 2/1979 | Green | 307/304 |
| 4,208,595 | 6/1980 | Gladstein et al. | 307/297 |

FOREIGN PATENT DOCUMENTS 49-42267 4/1974 Japan .

OTHER PUBLICATIONS

*Dingwall et al.*, IEEE Journal of Solid-State Circuits, vol. SC-14, No. 5, pp. 867-872, Oct. 1979.

*Pashley and McCormick*, IEEE International Solid-State Circuits Conference, pp. 138-139, (Feb. 19, 1976).

*Primary Examiner*—Stanley D. Miller

*Assistant Examiner*—David R. Hupspeth

*Attorney, Agent, or Firm*—Finnegan, Henderson, Farabow, Garrett & Dunner

[57] ABSTRACT

Disclosed is a substrate bias generator circuit which comprises an oscillator circuit, a driving circuit producing a rectangular-wave signal in accordance with an oscillation output signal from the oscillator circuit, and a charge pump circuit pumping electric charges into a substrate in accordance with the rectangular-wave output signal from the driving circuit. The oscillator circuit is a voltage-controlled oscillator circuit whose oscillation frequency is controlled in accordance with a substrate bias voltage from the charge pump circuit.

6 Claims, 5 Drawing Figures

FIG. 1
PRIOR ART
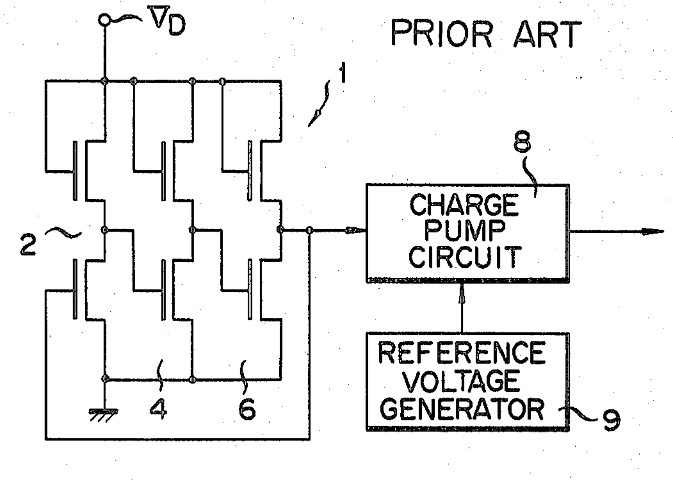
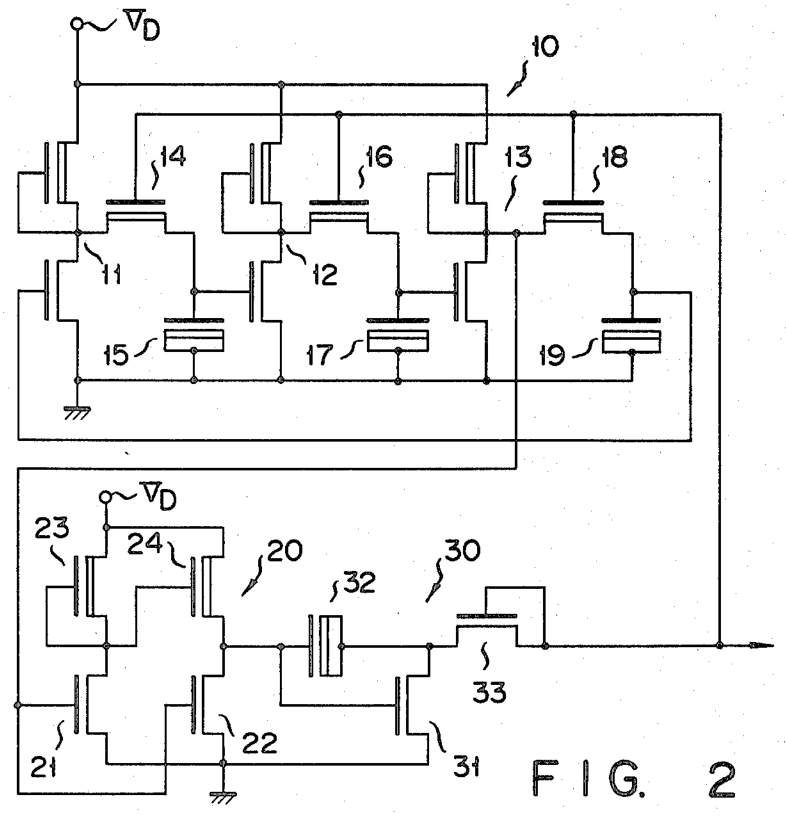
FIG. 2

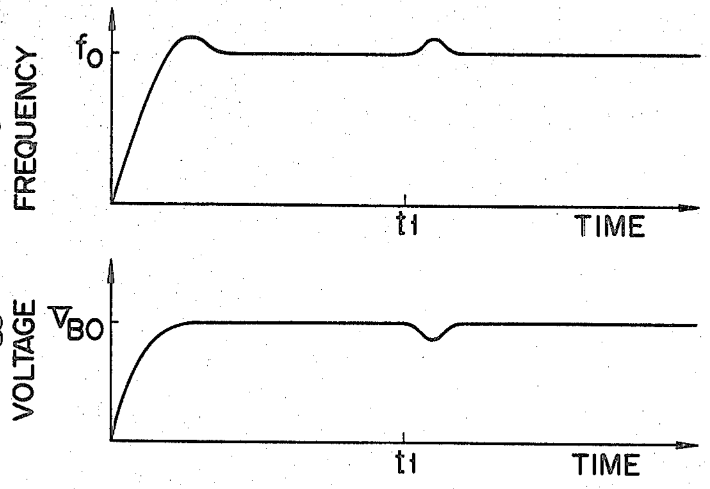
FIG. 3A
FIG. 3B
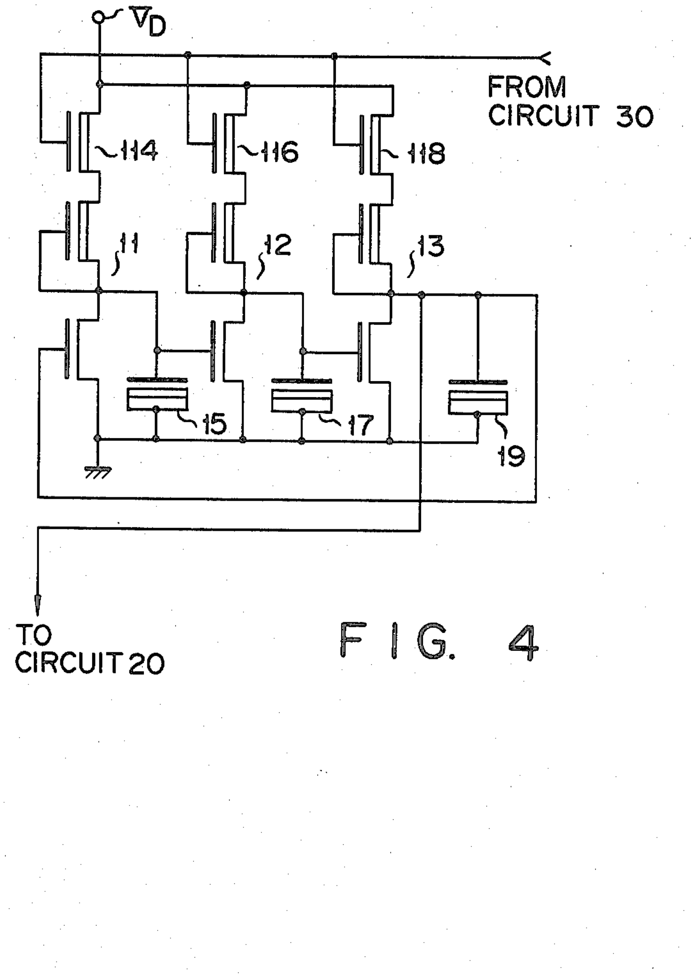
FIG. 4

SUBSTRATE BIAS GENERATION CIRCUIT

This invention relates to a substrate bias generation circuit producing stable substrate bias.

In an MOS integrated circuit of these days, a substrate bias generation circuit, as shown in FIG. 1 for example, is formed on the same substrate that carries the integrated circuit in order to apply a given substrate bias voltage to the substrate. This substrate bias generation circuit includes a ring oscillator formed of three cascade-connected MOS inverters 2, 4 and 6, the output terminal of the last-stage MOS inverter 6 being coupled to the input terminal of the first-stage MOS inverter 2, and a charge pump circuit 8 which is to be energized by a reference voltage from a reference voltage generator 9 to pump negative electric charges into the substrate in accordance with an output signal from the oscillator 1, thereby applying a negative bias voltage $V_B$ to the substrate.

If the substrate bias generation circuit of this type is formed on the same substrate with a memory or logic circuit, a leakage current will possibly flow into the substrate to lower the substrate voltage while the memory or logic circuit is operating. In such a case, although the substrate voltage is restored to a predetermined voltage level by the charge pump function of the charge pump circuit 8, it requires a considerably long time for the predetermined substrate voltage to be established again. Accordingly, the substrate voltage will possibly fluctuate during the operation of the memory circuit or the like to exert an unnecessary influence upon the operation of the memory circuit.

The object of this invention is to provide a substrate bias generation circuit capable of producing stable substrate bias, with the charge pump speed changed in accordance with the variation of the substrate voltage.

According to an embodiment of this invention, there is provided a substrate bias generation circuit which comprises a voltage-controlled oscillator circuit, a driving circuit producing a driving signal in accordance with an oscillation output signal from the oscillator circuit, and a charge pump circuit producing a substrate bias voltage in accordance with the driving signal from the driving circuit, the substrate bias voltage from the charge pump circuit being supplied also to a control terminal of the voltage-controlled oscillator circuit.

In this invention, when the substrate voltage is lowered by a leakage current flowing at the time of the operation of a main circuit, the oscillation frequency of the voltage-controlled oscillator circuit is increased in response to the drop of the substrate voltage, so that the charge pump circuit pumps charges into the substrate at a higher rate. As a result, the substrate voltage is immediately restored to a predetermined voltage level, and the influence of the fluctuation of the substrate voltage upon the main circuit may substantially be minimized.

This invention can be more fully understood from the following detailed description when taken in conjunction with the accompanying drawings, in which:

FIG. 1 is a circuit diagram of a prior art substrate bias generation circuit;

FIG. 2 is a circuit diagram of a substrate bias generation circuit according to an embodiment of this invention;

FIGS. 3A and 3B show signal waveforms for illustrating the operation of the substrate bias generation circuit of FIG. 2; and FIG. 4 is a modification of a ring oscillator used in the embodiment of FIG. 1.

As shown in FIG. 2, a substrate bias generation circuit according to an embodiment of this invention includes a voltage-controlled oscillator circuit 10, a driving circuit 20 producing a pulse signal at a rate corresponding to an oscillation output signal from the oscillator circuit 10, and a charge pump circuit 30 for pumping electric charges into a substrate in accordance with a pulse output signal from the driving circuit 20.

In this embodiment, the voltage-controlled oscillator circuit 10 is formed of a ring oscillator including three MOS inverters 11, 12 and 13 which are each composed of a depletion-type (D-type) MOS transistor and an enhancement-type (E-type) MOS transistor coupled in series between a power supply terminal $V_D$ and the ground. The output terminal of the MOS inverter 11 is coupled to the input terminal of the MOS inverter 12 through a delay circuit which is formed of a D-type MOS transistor 14 and an MOS capacitor 15, the output terminal of the MOS inverter 12 is coupled to the input terminal of the MOS inverter 13 through a delay circuit which is formed of a D-type MOS transistor 16 and an MOS capacitor 17, and the output terminal of the MOS inverter 13 is coupled to the input terminal of the MOS inverter 11 through a delay circuit which is formed of a D-type MOS transistor 18 and an MOS capacitor 19.

The driving circuit 20 includes E-type MOS transistors 21 and 22 having their gates coupled with the output terminal of the MOS inverter 13 of the ring oscillator 10 and their sources grounded, and D-type MOS transistors 23 and 24 having their sources coupled respectively with the drains of the E-type MOS transistors 21 and 22 and their drains connected to the power supply terminal $V_D$. The source of the MOS transistor 23 is coupled with the gates of the MOS transistors 23 and 24.

The charge pump circuit 30 includes an E-type MOS transistor 31 having its gate coupled with the drain of the MOS transistor 22 of the driving circuit 20 and its source grounded, an MOS capacitor 32 coupled between the gate and drain of the MOS transistor 31, and an E-type MOS transistor 33 having its source coupled with the drain of the MOS transistor 31. The gate and drain of the MOS transistor 33 are both coupled with the gates of the MOS transistors 14, 16 and 18 of the ring oscillator 10.

Referring now to FIGS. 3A and 3B, there will be described the operation of the substrate bias generation circuit shown in FIG. 2.

When supply voltage is applied to the power supply terminal $V_D$, the ring oscillator 10 produces an oscillator output signal of frequency $f_o$, as shown in FIG. 3A, if the substrate bias generator circuit operates normally. The MOS transistors 21 and 22 are caused to conduct in response to a positive half-cycle output signal component from the ring oscillator 10, and a low-level output signal is generated from the driving circuit 20. If a negative half-cycle output signal component is generated from the ring oscillator 10, then the MOS transistors 21 and 22 are rendered nonconductive, and a high-level output signal is generated from the driving circuit 20. Namely, the driving circuit 20 produces a pulse signal of frequency $f_o$ in response to the oscillation output signal of frequency $f_o$ from the ring oscillator 10. In response to the high-level output signal from the driving circuit 20, the MOS transistors 31 and 33 of the charge pump circuit 30 are turned on and off, respectively. In this case, therefore, electric charges of an amount corresponding to the supply voltage are stored in the MOS capacitor 32. Thereafter, when the low-level output signal is generated from the driving circuit 20, the MOS transistors 31 and 33 are turned off and on, respectively. Thus, the positive charges stored in the MOS capacitor 32 are discharged through the MOS transistor 22, and the negative charges are pumped into the substrate (not shown) through the MOS transistor 33. In this way, a substrate bias voltage $V_B$ is maintained at a predetermined level $V_{B0}$ by the charge pumping action of the charge pump circuit 30, as shown in FIG. 3B.

Here, suppose that the absolute value of the substrate bias voltage $V_B$ is reduced at time $t_1$ by an operating current caused to flow at the time of an operation of e.g. a memory circuit (not shown) formed on the substrate, as shown in FIG. 3B. In this case, the absolute values of the gate voltages of the MOS transistors 14, 16 and 18 of the ring oscillator 10 are reduced to diminish the resistance values of these MOS transistors 14, 16 and 18, thereby decreasing the time constants of the delay circuits in which the MOS transistors 14, 16 and 18 cooperate with the MOS capacitors 15, 17 and 19. Accordingly, the oscillation frequency of the ring oscillator 10 increases as shown in FIG. 3A. Thus, when an oscillation output signal with a higher frequency than the frequency $f_o$ is generated from the ring oscillator 10, the driving circuit 20 produces pulse signals at a higher rate to drive the charge pump circuit 30 at a higher operating speed. As a result, a large quantity of negative charges are pumped into the substrate in a short time to bring the substrate potential close to the predetermined level $V_{B0}$ as shown in FIG. 3B. As the absolute value of the substrate potential $V_B$ increases, the conduction resistances of the MOS transistors 14, 16 and 18 increase gradually. When the substrate potential $V_B$ reach the predetermined level $V_{B0}$, the ring oscillator 10 again executes the oscillating operation at the predetermined frequency $f_o$. Thus, in this embodiment, the oscillation frequency of the ring oscillator 10 is increased to raise the operating speed of the charge pump circuit 30 when the substrate potential $V_B$ is reduced so that the substrate potential $V_B$ may instantaneously be restored to the predetermined level $V_{B0}$. Accordingly, the influence of the change of the substrate potential caused by the operating current flow at the time of the operation of the memory circuit or the like upon the operation of the memory circuit can be ignored.

When the charge pump circuit 30 operates at a high speed, that is, when the absolute value of the substrate voltage $V_B$ is reduced, the current consumed in the ring oscillator 10 is relatively great. When the charge pump circuit 30 operates normally, that is, when the substrate voltage $V_B$ is maintained at the predetermined level $V_{B0}$, however, the consumption current in the ring oscillator 10 can be minimized.

Although an illustrative embodiment of this invention has been described in detail herein, the invention is not limited to such precise embodiment. For example, the MOS inverters 11, 12 and 13 constituting the ring oscillator 10 may also be each formed of two series-connected E-type MOS transistors. Further, the ring oscillator 10 may also be formed of a single or an odd number of MOS inverters. Moreover, where the oscillation frequency of the ring oscillator 10 can be changed within a desired range by controlling the resistance values of the load MOS transistors of the MOS inverters 11, 12 and 13 by means of the substrate bias voltage, the delay circuits formed of the MOS transistors 14, 16 and 18 and the MOS capacitors 15, 17 and 19 may be removed. Although N-channel MOS transistors are used in the substrate bias generation circuit shown in FIG. 2, P-channel MOS transistors may be used instead. Further, the MOS capacitors 19, 15 and 17 may be removed if the gate capacities of the switching MOS transistors of the MOS inverters 11, 12 and 13 are great enough.

As shown in FIG. 4, furthermore, MOS transistors 114, 116 and 118 may be coupled between the load MOS transistors of the MOS inverters 11, 12 and 13 and the power supply terminal $V_D$ instead of using the transistors 14, 16 and 18 which constitute the delay circuits. In this case, the MOS transistors 114, 116 and 118 are directly coupled in series with the MOS capacitors 15, 17 and 19, respectively, between the power supply terminal $V_D$ and the ground to form delay circuits.

What is claimed is:

1. A substrate bias generation circuit comprising:
   - a voltage-controlled oscillator circuit having a controlled terminal for receiving an input signal for controlling said voltage-controlled oscillator circuit to produce an oscillation output signal, said voltage-controlled oscillator circuit including a ring oscillator circuit comprising an odd number of inverter means each having a delay function with a delay time changed in accordance with said input signal received by said control terminal;
   - a driving circuit for producing a driving signal in accordance with said oscillation output signal from said oscillator circuit; and
   - a charge pump circuit for producing a substrate bias voltage in accordance with said driving signal from said driving circuit, said substrate bias voltage being supplied to said control terminal of said oscillator circuit to control the delay time of each of said inverter means.

2. A substrate bias generation circuit according to claim 1, wherein each of said inverter means includes an inverter circuit and a delay circuit coupled in series with said inverter circuit and having its delay time changed in accordance with the substrate bias voltage from said charge pump circuit.

3. A substrate bias generation circuit according to claim 2, wherein said delay circuit includes a delay MOS transistor to receive at its gate the substrate bias voltage from said charge pump circuit and a capacitor coupled in series with said delay MOS transistor.

4. A substrate bias generation circuit according to claim 1, wherein each of said inverter means includes a series circuit of resistive means and an MOS transistor having a gate connected to said control terminal of said voltage-controlled oscillator circuit, a switching MOS transistor coupled with said series circuit, and a capacitor coupled with a junction between said series circuit and said switching MOS transistor.

5. A substrate bias generation circuit comprising:
   - a charge pump circuit for producing a substrate bias voltage;
   - a driving circuit for producing a driving signal for controlling the voltage level of said substrate bias voltage generated by said charge pump circuit; and
   - a voltage-controlled oscillator circuit having a ring oscillator circuit comprising an odd number of circuit units, each of said circuit units being provided with an input terminal and an output terminal, a series circuit including an MOS transistor for receiving at a gate electrode the substrate bias voltage from said charge pump circuit and resistive means, said series circuits being coupled at one end to said output terminal and having a current path coupled with said output terminal.

6. A substrate bias generation circuit comprising;

a charge pump circuit for producing a substrate bias voltage;

a driving circuit for producing a driving signal, said driving signal being supplied to said charge pump circuit to control the voltage level of said substrate bias voltage; and a voltage-controlled oscillator circuit having a ring oscillator circuit comprising an odd number of circuit units, each of said circuit units including an MOS inverter comprising a resistive means and a switching MOS transistor, and an MOS transistor having a current path coupled in series with said MOS inverter and receiving at a gate terminal said substrate bias voltage produced by said charge pump circuit.

* * * * *